(12) United States Patent
Kawaguchi et al.

(10) Patent No.: US 7,579,768 B2
(45) Date of Patent: Aug. 25, 2009

(54) ORGANIC ELECTROLUMINESCENT DEVICE WITH IMPROVED MOISTURE PROTECTION

(75) Inventors: Koji Kawaguchi, Nagano (JP); Makoto Kobayashi, Nagano (JP); Toshio Hama, Nagano (JP); Kenya Sakurai, Nagano (JP)

(73) Assignee: Fuji Electric Holdings Co., Ltd. (JP)

( * ) Notice: Subject to any disclaimer, the term of this patent is extended or adjusted under 35 U.S.C. 154(b) by 392 days.

(21) Appl. No.: 11/226,926

(22) Filed: Sep. 14, 2005

(65) Prior Publication Data

US 2006/0082286 A1    Apr. 20, 2006

(30) Foreign Application Priority Data

Oct. 19, 2004    (JP)    ............... 2004-304723

(51) Int. Cl.
H01J 1/62    (2006.01)
(52) U.S. Cl. .................. 313/503; 313/504; 313/506
(58) Field of Classification Search ......... 313/503–506, 313/509; 428/690, 917; 257/40
See application file for complete search history.

(56) References Cited

U.S. PATENT DOCUMENTS

| | | | | |
|---|---|---|---|---|
| 5,754,216 | A * | 5/1998 | Higuchi et al. | 347/238 |
| 7,038,373 | B2 * | 5/2006 | Arnold et al. | 313/506 |
| 2001/0030508 | A1 * | 10/2001 | Utsugi et al. | 313/505 |
| 2004/0007972 | A1 * | 1/2004 | Wang | 313/506 |
| 2006/0027819 | A1 * | 2/2006 | Hu | 257/83 |

FOREIGN PATENT DOCUMENTS

| | | |
|---|---|---|
| JP | 5-134112 A | 5/1993 |
| JP | 7-146480 A | 6/1995 |
| JP | 7-218717 A | 8/1995 |
| JP | 7-306311 A | 11/1995 |
| JP | 8-279394 A | 10/1996 |
| JP | 10-10518 A | 1/1998 |
| JP | 2000-214318 A | 8/2000 |
| JP | 2004-207014 | 7/2004 |

OTHER PUBLICATIONS

Relevant portion of UK search report for corresponding patent application No. GB0518500.4. Mailing date: Jan. 10, 2006.
Tang, C.W. et al., "Organic electroluminescent diodes," Appl. Phys. Lett. 51 (12), Sep. 21, 1987, pp. 913-915, 1987 American Institute of Physics.

* cited by examiner

Primary Examiner—Joseph L Williams
Assistant Examiner—Fatima N Farokhrooz
(74) Attorney, Agent, or Firm—Rossi, Kimms & McDowell LLP

(57) ABSTRACT

An organic EL device is disclosed that prevents degradation due to moisture and oxygen and that avoids the generation of dark spots even when a substrate covered with polymer or made of a resin is used. The organic EL device includes a substrate, a transparent electrode consisting of a plurality of electrode elements formed on the substrate, an organic EL layer formed on the transparent electrode, and a reflection electrode formed on the organic EL layer. The transparent electrode includes first and second transparent electrode elements. Each of the first transparent electrode elements is arranged alternately with each of the second transparent electrode elements. A side edge portion of each of the first transparent electrode elements overlaps a side edge portion of next second transparent electrode element through an insulation layer. The first transparent electrode elements are electrically insulated from the second transparent electrode elements.

11 Claims, 2 Drawing Sheets

ORGANIC ELECTROLUMINESCENT DEVICE WITH IMPROVED MOISTURE PROTECTION

CROSS REFERENCE TO RELATED APPLICATIONS

This application is based on, and claims priority to, Japanese Application No. 2004-304723, filed on Oct. 19, 2004, the contents of which are incorporated herein by reference.

BACKGROUND OF THE INVENTION

A. Field of the Invention

The present invention relates to an organic EL device, in particular, to an organic EL device using a resin substrate or a flexible film substrate.

B. Description of the Related Art

Since the publication of an organic EL device having a double-layered structure and exhibiting high efficiency by C. W. Tang et al. of Eastman Kodak Company in 1987, various types of organic EL devices have been developed, and practical application has begun in some of the devices. (See C. W. Tang et al., *Appl. Phys. Lett.* 51, 913 (1987).) In this circumstance, the developments for practical application are actively and rapidly being made on full-color organic EL displays using an organic EL device as a next generation display.

Critical issues in practical application of color displays are capability of precise color display and long term stability, including color reproducibility. A color organic EL display, however, has a drawback that the light emission characteristic (current-brightness characteristic) significantly degrades after a certain period of operation.

One of the most important causes of this degradation of light emission characteristic is the growth of dark spots. The dark spot is a spot of failure of light emission. The dark spots grow by oxidation during operation or storage and expand to the entire surface of light emission. The dark spots are considered to occur due to oxidation or aggregation in the laminated material composing the device by oxygen or moisture in the device. The growth progresses during storage as well as in operation. The growth is: (1) accelerated by oxygen or moisture around the device, (2) affected by oxygen or moisture existing as an adherent to the organic laminated films, and (3) affected by moisture adhering to the parts for fabricating the device or moisture invaded in the manufacturing process.

To prevent moisture from invading an organic EL device, it has been proposed to provide an insulating barrier layer against the moisture and oxygen on the substrate. Known techniques for the barrier layer against moisture and oxygen include provision of an organic resin such as polyimide-modified silicone resin (see, for example, Japanese Unexamined Patent Application Publication Nos. H5-134112, H7-218717, and H7-306311) and provision of an inorganic oxide layer having a thickness in the range of 0.01 to 200 µm (see for example, Japanese Unexamined Patent Application Publication No. H8-279394). Such an inorganic oxide layer must be highly moisture proof in order to maintain a long life of the organic light emitting layer.

A method of fabricating a color filter provided with one or more color filter layers on a substrate is known, in which $SiO_x$ or $SiN_x$ is formed by DC sputtering on a polymer film formed on the color filter layer, and the method has an effect to improve adhesiveness of a transparent conductive film. (See Japanese Unexamined Patent Application Publication Nos. H7-146480 and H10-10518.) A method to sinter low melting point glass also is known. (See Japanese Unexamined Patent Application Publication No. 2000-214318.)

Active studies have been made regarding the performance degradation of organic EL devices, and various causes therefor have been reported. Among the causes of degradation, one of the serious problems is performance degradation by the heat generated in the device operation, since the organic EL layer including a light emitting layer is composed of a poor heat resistive material.

The inorganic oxide film such as $SiO_x$ or $SiN_x$ is known to be liable to generate pinholes through the film. Such pinholes allow moisture or oxygen to reach the organic EL layer through the pinholes and the dark spots may grow.

When a substrate covered with polymer or a resin substrate is used, the polymer or the resin is known to contain moisture or oxygen. The moisture or the oxygen is known to be released from the substrate by heat generated by operation of the organic EL device, and reaches the organic EL layer to promote the growth of dark spots. In addition, such substrates include significant size irregularities on their surface, and some of these irregularities may not be thoroughly covered with the barrier layer against moisture and oxygen. If an exposed portion exists, the moisture or oxygen in the substrate leaks through the exposed portion and causes the dark spots to grow. In the case of a barrier layer against moisture and oxygen made of an organic resin, in particular, once a dark spot is formed, the growth is noticeable.

Consequently, a structure is eagerly demanded that surely obstructs invasion of moisture and oxygen into an organic EL layer and prevents occurrence of dark spots even in the cases of a substrate covered with polymer and a resin substrate.

The present invention is directed to overcoming or at least reducing the effects of one or more of the problems set forth above.

SUMMARY OF THE INVENTION

An organic EL device of the present invention comprises a substrate, a transparent electrode consisting of a plurality of electrode elements formed on the substrate, an organic EL layer formed on the transparent electrode, and a reflection electrode formed on the organic EL layer. The transparent electrode consists of first transparent electrode elements and second transparent electrode elements. Each of the first transparent electrode elements is arranged alternately with each of the second transparent electrode elements. A side edge portion of each of the first transparent electrode elements overlaps a side edge portion of next second transparent electrode element through an insulation layer. The first transparent electrode elements are insulated from the second transparent electrode elements. The first transparent electrode elements and the second transparent electrode elements can be formed of a material selected from the group consisting of $SnO_2$, $In_2O_3$, ITO, IZO, and ZnO:Al. The substrate can be selected from a transparent substrate, a transparent substrate covered with an organic resin, a transparent substrate provided with one or more color modulation parts, and a transparent substrate provided with one or more color modulation parts and covered with an organic resin. The transparent substrate can be selected from a glass substrate, a resin substrate, and a flexible film, the resin substrate and the flexible film being formed of a material selected from a polyester resin including poly(ethylene terephthalate), acrylic resin including poly(methyl methacrylate), polyolefin, polycarbonate resin, and polyimide resin.

The organic EL device can further comprise second insulation films each covering the side edge portion of each of the second transparent electrode elements, as required. The second insulation films can be formed of an organic resin, an insulative inorganic oxide, an insulative inorganic nitride, and an insulative inorganic oxide nitride. The organic EL device can further comprise a substrate passivation layer between the substrate and the transparent electrode, the substrate passivation layer being formed of a material selected from an insulative inorganic oxide, an insulative inorganic nitride, and an insulative inorganic oxide nitride including $SiO_x$, $SiN_x$, $SiN_xO_y$, $AlO_x$, $TiO_x$, $TaO_x$, and $ZnO_x$.

By featuring the above-described structure, either a transparent electrode or a passivation layer formed of a transparent conductive oxide that effectively interrupt moisture and oxygen is provided throughout the entire region of the substrate, thereby effectively preventing the moisture and oxygen from invading from the substrate to the organic EL layer. Consequently, an organic EL device is provided that is free of dark spot generation and maintains good light emitting performance in a long period.

The inventors of the present invention have made extensive studies and found that dark spots mostly occur in the periphery of a transparent electrode element, and rarely occur inside the transparent electrode element. This fact shows that a transparent conductive oxide composing the transparent electrode elements has remarkably effective characteristics for intercepting moisture and oxygen. The present invention, based on this fact, provides an organic EL device that effectively avoids the dark spot generation.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
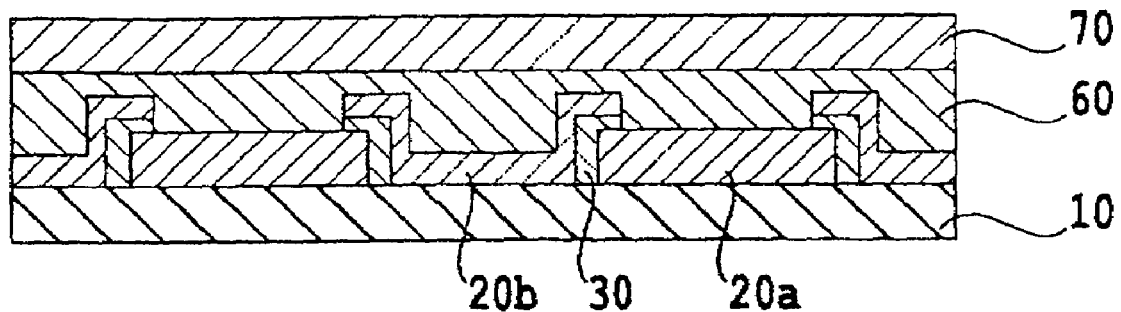
FIG. 1 is a sectional view of an organic EL device of an embodiment example according to the invention.

FIG. 1 shows an organic EL device of an embodiment according to the invention. An organic EL device of the invention comprises transparent electrode 20 consisting of a plurality of electrode elements, organic EL layer 60 and reflection electrode 70 sequentially laminated on substrate 10. Transparent electrode 20 consists of first transparent electrode elements 20a and second transparent electrode elements 20b. Each of first transparent electrode elements 20a is arranged alternately with each of second transparent electrode elements 20b. A side edge portion of each of first transparent electrode elements 20a overlaps a side edge portion of next second transparent electrode element 20b through an insulation layer. The first transparent electrode elements are electrically insulated from the second transparent electrode elements.

Substrate 10 can be a transparent substrate or a color conversion filter having a color modulation part on a transparent substrate. Those substrates may be covered with transparent organic resin, as desired. A transparent substrate must be transparent for visible light (having wavelengths from 400 to 700 nm) and durable against the conditions (solvent, temperature, etc.) in the processes of forming laminated layers. A transparent substrate preferably exhibits good dimensional stability. Preferred transparent substrates include a glass substrate and a rigid resin substrate formed of polyolefin, acrylic resin (including poly(methyl methacrylate)), polyester resin (including poly(ethylene terephthalate)), polycarbonate resin, polyimide resin, or the like. A substrate can be alternatively, a flexible film formed of polyolefin, acrylic resin (including poly(methyl methacrylate)), polyester resin (including poly(ethylene terephthalate)), polycarbonate resin, polyimide resin or the like.

A color modulation part provided on a transparent substrate can be composed of a color filter layer, a color conversion layer, or a lamination of a color filter layer and a color conversion layer. A color filter layer only transmits light in a desired wavelength range. In the lamination with a color conversion layer, a color filter layer is effective to improve color purity of the light in which wavelength distribution is converted by the color conversion layer. A color conversion layer can be formed using a commercially available color filter material for liquid crystals (COLOR MOSAIC™, manufactured by Fujifilm Arch Co., Ltd., for example).

A color conversion layer is composed of color conversion dye and matrix resin. A color conversion dye converts wavelength distribution of incident light and emits light in different wavelength range. The color conversion dye preferably converts wavelength of near ultraviolet light or blue to blue-green light from an organic light emitting layer and emits light in a desired wavelength range (for example, glue, green, or red). Any appropriate color conversion dye known in the art can be used such as rhodamine dye and cyanine dye that emit red light; coumarin dye and naphthalimido dye that emit green light; and coumarin dye that emits blue light.

Plural types of color modulation parts can be provided on a transparent substrate; for example, a red color modulation part that absorbs light from an organic light emitting layer and emits red light, a green color modulation part that emits green light, and a blue color modulation part that emits blue light. A structure capable of full color display can be taken in an organic EL device of the invention by arranging plural types of color modulation parts in a matrix form.

The color modulation parts can be formed by applying appropriate materials for the layers by means of spin coating, roll coating, casting, or dip coating and subsequently patterning by lithography. As required, a smoothing layer (that can be formed of various resins) to smooth a surface for electrode deposition is formed covering the color modulation parts. In this structure, the substrate (that is a color conversion filter having color modulation parts) is covered with organic resin.

A substrate passivation layer may be formed between the substrate and the transparent electrode (that is, on the surface of transparent substrate or covering the color modulation parts, if provided). The substrate passivation layer serves a part of the function to intercept oxygen and/or moisture. The substrate passivation layer can be formed of insulative inorganic oxide, inorganic nitride, or inorganic oxide nitride, such as $SiO_x$, $SiN_x$, $SiN_xO_y$, $AlO_x$, $TiO_x$, $TaO_x$, and $ZnO_x$. The substrate passivation layer generally has a thickness in a range of 0.1 to 1 μm.

Transparent electrode 20 consists of first transparent electrode elements 20a and second transparent electrode elements 20b. Each of first transparent electrode elements 20a is arranged alternately with each of second transparent electrode elements 20b. A side edge portion of each of first transparent electrode elements 20a overlaps a side edge portion of the next second transparent electrode element 20b through an insulation layer. First transparent electrode elements 20a are electrically insulated from second transparent electrode elements 20b. First transparent electrode elements 20a and second transparent electrode elements 20b are formed by depositing a conductive metal oxide such as $SnO_2$, $In_2O_3$, ITO, IZO, or ZnO:Al by a sputtering method. First transparent electrode elements 20a and second transparent electrode elements 20b preferably exhibit a transmissivity not smaller than 50%, and more preferably 85% or more, for light with a wavelength in a range of 400 to 800 nm. Transparent electrode 20 has a thickness that generally is not less than 50 nm, preferably in a range of 50 nm to 1 µm, and more preferably in a range of 100 to 300 nm. First transparent electrode elements 20a and second transparent electrode elements 20b in the invention are composed of a conductive metal oxide that has a property of intercepting moisture and oxygen satisfactorily, and are principal structural elements that serve a function to prevent moisture and oxygen from penetrating from the substrate. By forming the side edge portion of first transparent electrode element 20a overlapping the side edge portion of second transparent electrode element 20b, as described above, the conductive metal oxide layer exhibiting satisfactory ability to intercept moisture and oxygen is provided on the entire region of substrate 10. Consequently, penetration of moisture and oxygen from substrate 10 to organic EL layer 60 is effectively obstructed.

First transparent electrode elements 20a and second transparent electrode elements 20b are composed of a plurality of electrode elements with a stripe shape extending in a first direction. Reflection electrode 70 is formed as a plurality of electrode elements with a stripe shape extending in a second direction crossing the first direction (preferably orthogonal to the first direction). The resulting structure favorably allows passive matrix driving.

Figure 2:
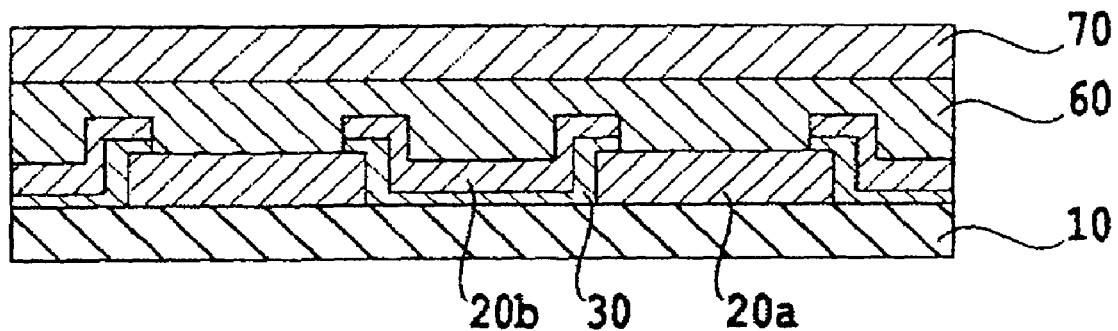
FIG. 2 is a sectional view of an organic EL device of another embodiment example according to the invention.

Insulation layer 30 is formed between first transparent electrode element 20a and second transparent electrode element 20b and performs electrical insulation between the adjacent first transparent electrode element and the second transparent electrode element. Insulation layer 30 is formed overlying and overlapping the side edge portion of first transparent electrode element 20a, and the side edge portion of the adjacent second transparent electrode element 20b is positioned overlapping this side edge portion of first transparent electrode element 20a. Preferred material for forming the insulation layer 30 can be selected from an inorganic oxide, an inorganic nitride, and an inorganic oxide nitride, such as $SiO_x$, $SiN_x$, $SiN_xO_y$, $AlO_x$, $TiO_x$, $TaO_x$, and $ZnO_x$. Therefore, insulation layer 30 also functions to obstruct penetration of moisture and oxygen, although there remains some degree of fear of pinhole generation. In the structure shown in FIG. 2, in which insulation layer 30 extends on the substrate in the region between two adjacent first transparent electrode elements 20a, the effect of obstructing penetration of moisture and oxygen is enhanced in addition to the effect of electrical insulation between the first and second transparent electrode elements. Insulation layer 30 can be formed by means of any technique known in the art including evaporation (resistance heating and electron beam heating), sputtering, ion plating, and laser abrasion.

Figure 3:
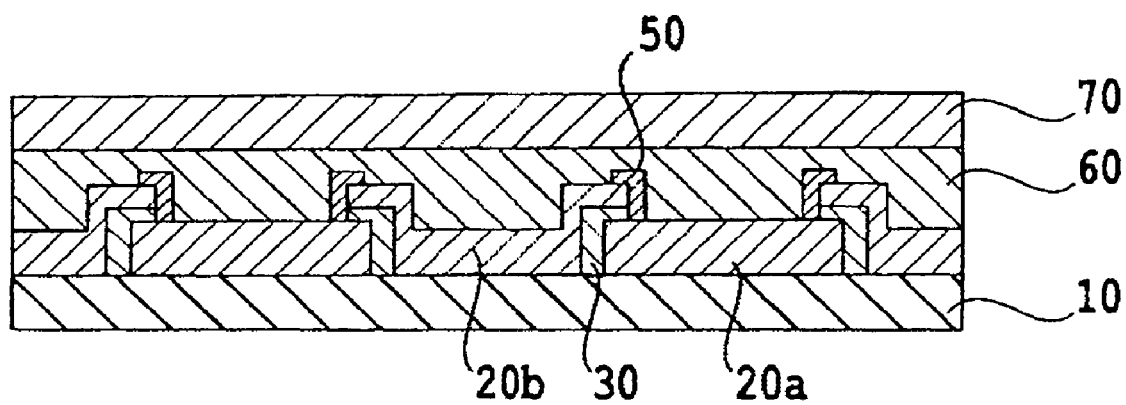
FIG. 3 is a sectional view of an organic EL device of still another embodiment example according to the invention.

As shown in FIG. 3, second insulation film 50 can be further provided that covers the side edge portion of the lamination of insulation layer 30 and second transparent electrode element 20b. Second insulation film 50 is effective to maintain electrical insulation between first transparent electrode element 20a and second transparent electrode element 20b for a long period. The second insulation film can be formed of an organic resin such as polyimide-modified silicone resin (see Japanese Unexamined Patent Application Publication Nos. H5-134112, H7-218717, and H7-306311, for example), or insulative inorganic oxide, insulative inorganic nitride, or insulative inorganic oxide nitride such as $SiO_x$, $SiN_x$, $SiN_xO_y$, $AlO_x$, $TiO_x$, $TaO_x$, or $ZnO_x$.

Transparent electrode 20 and the insulation layers 30 are formed by first depositing first transparent electrode elements 20a with a desired shape on substrate 10, then depositing insulation layers 30 at the desired location, and finally depositing second transparent electrode element 20b with a desired shape. The first transparent electrode elements with a desired shape can be deposited using a mask giving that desired shape, or by depositing on the entire surface of the substrate followed by patterning employing photolithography (the patterning can be carried out by wet etching or dry etching). Insulation layer 30 can be formed in a desired shape by depositing an insulation material on the entire surface of the substrate that has first transparent electrode elements 20a formed thereon followed by dry etching, or alternatively, by forming a lift-off resist having a desired pattern and subsequently depositing an insulation material, followed by removing the resist employing a lift-off technique. Second transparent electrode elements 20b can be formed by depositing a conductive metal oxide by sputtering on the entire surface of substrate 10 having insulation layers 30 formed thereon followed by dry etching, of by employing a lift-off technique.

When a lift-off technique is applied to form insulation layers 30 and to form second transparent electrode elements 20b, the patterning of both of the layers and the electrodes can be carried out simultaneously. For example, insulation layers 30 and second transparent electrode elements 20b are sequentially laminated on the substrate having the lift-off resist formed thereon, and then the lift-off resist is removed to obtain insulation layers 30 and second transparent electrode elements 20b with desired shapes simultaneously.

Organic EL layer 60 at least includes an organic light emitting layer and, as required, further includes a hole transport layer, a hole injection layer, an electron transport layer, and/or electron injection layer. Each layer is formed with sufficient thickness to achieve the performance desired for the layer. The organic EL layer can have one of the following layer structures:

(1) organic light emitting layer
(2) hole injection layer/organic light emitting layer
(3) organic light emitting layer/electron injection layer
(4) hole injection layer/organic light emitting layer/electron injection layer
(5) hole transport layer/organic light emitting layer/electron injection layer
(6) hole injection layer/hole transport layer/organic light emitting layer/electron injection layer
(7) hole injection layer/hole transport layer/organic light emitting layer/electron transport layer/electron injection layer.

In the above layer structures, an electrode functioning as an anode is connected to the left side of each list of layers and an electrode functioning as a cathode is connected to the right side.

A material for the organic light emitting layer can be selected from known materials. Preferred materials to obtain light emission in blue to blue-green color include condensed aromatics, ring assemblies compounds, metal complex (for example, an aluminum complex such as Alq3), styryl benzene compounds (such as 4,4'-bis(diphenyl vinyl)biphenyl (DPVBi), porphyrin compounds, fluorescent whitening agents including benzothiazole, benzoimidazole, and benzoxazole, and aromatic dimethylidine compounds. Further, an organic light emitting layer that emits light in varied wavelength range can be formed by adding a dopant in a host compound. The host compound can be selected from distyryl arylene compounds (for example, IDE-120 manufactured by Idemitsu Kosan Co., Ltd.), N,N'-ditolyl-N,N'-diphenylbiphenylamine (TPD), and aluminum tris(8-quinolinolate) (Alq3). The dopant can be selected from perylene (blue-violet color), coumarin 6 (blue color), quinacridone compound (blue-green to green color), rubrene (yellow color), 4-dicyanomethylene-2-(p-dimethyaminostyryl)-6-methyl-4H-pyrane (DCM, red color), and platinum octaethyl porphyrin complex (PtOEP, red color).

A material for the hole injection layer can be selected from phthalocyanines (including copper phthalocyanine (CuPc)) and indanthrene compounds. The hole transport layer can be formed of a triarylamine derivative, a carbazole derivative, or an oxadiazole derivative. Preferred materials include TPD, α-NPD, MTDAPB (o-, m-, and p-), and m-MTDATA.

A material used for the electron transport layer can be selected from aluminum complexes such as Alq3, oxadiazole derivatives such as PBD and TPOB, triazole derivatives such as TAZ, phenylquinoxalines, and thiphene derivatives such as BMB-2T. A material used for the electron injection layer can be selected from aluminum complex such as Alq3 and quinolinol complex of aluminum doped with alkali metal or an alkaline earth metal.

A buffer layer may be optionally provided at the interface between organic EL layer 60 and an electrode used for a cathode. The buffer layer can be formed of a thin film (having a thickness not more than 10 nm) of an electron injective material that is selected from alkali metals, alkaline earth metals, alloys of these metals, fluorides of an alkali metal, to enhance electron injection efficiency. Each layer composing organic EL layer 60 can be formed by any appropriate means known in the art for example evaporation (resistance heating or electron beam heating).

Reflection electrode 70, consisting of a plurality of electrode elements, is preferably formed of a metal, an amorphous alloy, or a microcrystalline alloy that exhibits high reflectivity. The high reflectivity metals include Al, Ag, Mo, W, Ni, and Cr. The high reflectivity amorphous alloys include NiP, NiB, CrP, and CrB. The high reflectivity microcrystalline alloys include NiAl. Reflection electrode 70 can be used either as a cathode or as an anode. In the case of reflection electrode 70 used as a cathode, the above mentioned buffer layer may be provided at an interface between reflection electrode 70 and organic EL layer 60 to improve efficiency of electron injection to organic EL layer 60.

Reflection electrode 70 can be formed by means of any technique known in the art including evaporation (resistance heating and electron beam heating), sputtering, ion plating, and laser abrasion according to the material used for the electrode. Reflection electrode elements 70 can also be formed using a mask that gives a desired shape or using separation walls having a reversed tapered cross section.

Each reflection electrode element 70 can have a stripe shape extending in the second direction. The second direction is preferably crossing, more preferably orthogonally crossing, the first direction in transparent electrode 20. This structure allows passive matrix driving, in which the organic EL layer emits light at the crossing points of transparent electrode element 20 and reflection electrode element 70 by applying an electric field to the transparent electrode element and the reflection electrode element.

EXAMPLE 1

IZO layer having a thickness of 100 nm was deposited on an entire surface of a substrate of polycarbonate (PC) resin 2 mm thick by a sputtering method using a target of IDIXO (a mixture of an oxide of indium and zinc and indium oxide, manufactured by Idemitsu Kosan Co., Ltd.). Then conducting patterning by a photolithography method, first transparent electrode elements having a stripe shape with a width of 110 μm and a spacing of 90 μm was formed.

Then, a lift-off resist was laminated on the first transparent electrode elements. Subsequently, an $SiO_x$ layer 300 nm thick was deposited by a DC sputtering method at the room temperature and an IZO layer 200 nm thick was deposited. After that, the lift-off resist was removed with a resist-stripping agent to form a lamination of the insulation layer of $SiO_x$ and the second transparent electrode element of IZO between the first transparent electrode elements. The lamination was formed overlapping the first electrode element in the region with a width of 10 μm on the side edge portion of the first transparent electrode element.

Then, a photoresist (V259PAP5 manufactured by Nippon Steel Chemical Co., Ltd.) was applied and patterned to form second insulation films each covering the side edge portion of the lamination of insulation layer and second transparent electrode element. The obtained second insulation film had a thickness of 1 μm over the second transparent electrode element and covered the first transparent electrode element in the region with a width of 10 μm from the edge of the lamination and the second transparent electrode element in the region with a width of 10 μm from the edge of the lamination. As a result, the whole transparent electrode consisting of the first and the second transparent electrode elements works as an electrode consisting of a plurality of stripe shaped parts with a width of 90 μm and a spacing of 20 μm.

The substrate having the structures described above including a passivation layer was installed in a resistance heating evaporation apparatus, and a hole injection layer, a hole transport layer, an organic light emitting layer, and an electron injection layer were sequentially deposited while maintaining the vacuum. The pressure in the vacuum chamber in the deposition processes was decreased to $1 \times 10^{-4}$ Pa. For a hole injection layer, copper phthalocyanine (CuPc) 100 nm thick was deposited; for a hole transport layer, 4,4'-bis[N-(1-naphthyl)-N-phenylamino]biphenyl (α-NPD) 20 nm thick was deposited; for an organic light emitting layer, 4,4'-bis(2,2'-diphenylvinyl)biphenyl (DPVBi) 30 nm thick was deposited; and for an electron injection layer, Alq3 20 nm thick was deposited.

While maintaining the vacuum, reflection electrode elements were formed by depositing Mg/Ag (weight ratio 10/1) having a thickness of 200 nm using a mask to give a stripe pattern with a width of 300 μm and a pitch of 330 μm (gap width of 30 μm) extending in a direction orthogonal to the stripe pattern of the transparent electrode. Thus, an organic EL device having a structure of FIG. 3 was obtained.

The thus obtained organic EL device was sealed with sealing glass (not shown in the figure) and a UV-hardening adhesive in a glove box under a dry nitrogen atmosphere (both oxygen and moisture concentrations were below 10 ppm).

EXAMPLE 2

An organic EL device was obtained in the same manner as in Example 1 except that a film of $SiO_x$ 200 nm thick was deposited on the PC substrate prior to the formation of first transparent electrode elements.

COMPARATIVE EXAMPLE 1

IZO layer having a thickness of 100 nm was deposited on an entire surface of a substrate of polycarbonate (PC) resin 2 mm thick by sputtering using a target of IDIXO. Then conducting patterning by a photolithography method, transparent electrode elements having a stripe shape with a width of 100 µm and a spacing of 10 µm.

Then, a lift-off resist was laminated on the transparent electrode elements. Subsequently, an $SiO_x$ layer 300 nm thick was deposited by DC sputtering method at room temperature. Then, the lift-off resist was removed with a resist-stripping agent to form an insulation layer of $SiO_x$ covering a region of 5 µm in the spacing between the transparent electrode elements and a region of 5 µm in the edge side of each transparent electrode element. As a result of the formation of the insulation layers, the transparent electrode elements works as an electrode consisting of a plurality of stripe shaped parts of a width 90 µm and a spacing of 20 µm.

After that, following the same procedure as in Example 1, an organic EL layer and a reflection electrode were formed and finally, sealing was conducted to obtain an organic EL device of Comparative Example 1.

COMPARATIVE EXAMPLE 2

An organic EL device was obtained in the same manner as in Comparative Example 1 except that a film of $SiO_x$ 200 nm thick was deposited on the PC substrate prior to the formation of transparent electrode elements.

EVALUATION

On each of the organic EL devices obtained in Examples 1 and 2 and Comparative Examples 1 and 2 (outline is given in Table 1), a half life of brightness was measured supplying continuous direct current to obtain an initial brightness of 1,000 cd/m2, and occurrence of dark spots was observed after current supply for 2,000 h at an initial brightness of 5,000 $cd/m^2$. The results are shown in Table 2.

TABLE 1

Structure of devices

| | Substrate | overlap of transparent electrode (*) |
|---|---|---|
| Example 1 | PC (2 mm) | provided |
| Example 2 | PC (2 mm)/$SiO_x$ (200 nm) | provided |
| Comp Ex 1 | PC (2 mm) | not provided |
| Comp Ex 2 | PC (2 mm)/$SiO_x$ (200 nm) | not provided |

(*) Overlap of first and second transparent electrode elements

TABLE 2

Occurrence of dark spots and half life of brightness

| | generation of dark spots | half life of brightness (h) (*) |
|---|---|---|
| Example 1 | not observed | 4,000 |
| Example 2 | not observed | 4,000 |
| Comp Ex 1 | observed | 500 |
| Comp Ex 2 | observed | 4,000 |

(*) Half life of brightness in continuous supply of current at an initial brightness of 1,000 $cd/m^2$ As shown in Table 2, the devices of Examples 1 and 2 did not generate dark spots, but these were generated in the devices of Comparative Examples 1 and 2. Moreover Examples 1 and 2 exhibited longer half life of brightness than in devices of Comparative Example 1. Therefore, it has been demonstrated that the first and second transparent electrode elements formed of a conductive metal oxide and partially overlapping each other effectively function as a layer to protect the organic EL layer 60 from moisture and oxygen.

In contrast, in the device of Comparative Example 1, it was observed that a light emission impossible region expands from the edge of each pixel (specifically, from the side edge of each transparent electrode element) with passage of time and the brightness decreases noticeably, resulting in lowering of half life of brightness. This can be attributed to the moisture and/or oxygen that penetrated through the gap between the transparent electrode elements and deteriorated the organic EL layer significantly.

The device of Comparative Example 2 did not show the expansion of light emission impossible region that was observed in the device of Comparative Example 1. This can be considered to result from the effect of the substrate passivation layer provided on the substrate. Nevertheless, in the device of Comparative Example 2, several tens to several hundreds of dark spots were observed throughout the device and thus it was found to be unsuitable for use in display devices.

As described so far, it has been demonstrated that the formation of a laminate of passivation layers consisting of an insulation layer and a transparent conductive oxide is effective to inhibit generation of dark spots and to achieve long life of an organic EL device.

Thus, an EL device has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. An organic EL device comprising:
a substrate,
a transparent electrode formed on the substrate,
an organic EL layer formed on the transparent electrode, and
a reflection electrode formed on the organic EL layer,
wherein the transparent electrode comprises first transparent electrode elements and second transparent electrode elements, each of the first transparent electrode elements being arranged alternately with each of the second transparent electrode elements, a side edge portion of each of the first transparent electrode elements overlapping a side edge portion of next second transparent electrode element through an insulation layer, and the first transparent electrode elements being electrically insulated from the second transparent electrode elements, each of the first transparent electrode elements and the second transparent electrode elements being in contact with the organic EL layer.

2. An organic EL device comprising:
a substrate,
a transparent electrode formed on the substrate,
an organic EL layer formed on the transparent electrode, and
a reflection electrode formed on the organic EL layer,
wherein the transparent electrode comprises first transparent electrode elements and second transparent electrode elements, each of the first transparent electrode elements being arranged alternately with each of the second transparent electrode elements, a side edge portion of each of the first transparent electrode elements overlapping a side edge portion of next second transparent electrode element through an insulation layer, and the first transparent electrode elements being electrically insulated from the second transparent electrode elements, further comprising second insulation films each covering the side edge portion of each of the second transparent electrode elements.

3. The organic EL device according to claim 2, wherein the second insulation films are formed of a material selected from the group consisting of an organic resin, an insulative inorganic oxide, an insulative inorganic nitride, and an insulative inorganic oxide nitride.

4. An organic EL device comprising:
a substrate,
a transparent electrode formed on the substrate,
an organic EL layer formed on the transparent electrode, and
a reflection electrode formed on the organic EL layer,
wherein the transparent electrode comprises first transparent electrode elements and second transparent electrode elements, each of the first transparent electrode elements being arranged alternately with each of the second transparent electrode elements, a side edge portion of each of the first transparent electrode elements overlapping a side edge portion of next second transparent electrode element through an insulation layer, and the first transparent electrode elements being electrically insulated from the second transparent electrode elements, each of the first transparent electrode elements and the second transparent electrode elements being in contact with the organic EL layer, wherein the first transparent electrode elements are covered with the insulation layer only on an edge portion thereof.

5. The organic EL device according to claim 4, wherein the first transparent electrode elements and the second transparent electrode elements are formed of a material selected from the group consisting of $SnO_2$, $In_2O_3$, ITO, IZO, and ZnO:Al.

6. The organic EL device according to claim 4, wherein the substrate is selected from the group consisting of a transparent substrate, a transparent substrate covered with an organic resin, a transparent substrate provided with one or more color modulation parts, and a transparent substrate provided with one or more color modulation parts and covered with an organic resin.

7. The organic EL device according to claim 4, further comprising a substrate passivation layer between the substrate and the transparent electrode, the substrate passivation layer being formed of a material selected from the group consisting of an insulative inorganic oxide, an insulative inorganic nitride, and an insulative inorganic oxide nitride.

8. The organic EL device according to claim 6, wherein the transparent substrate is selected from the group consisting of a glass substrate, a resin substrate, and a flexible film, the resin substrate and the flexible film being formed of a material selected from a polyester resin including poly(ethylene terephthalate), acrylic resin including poly(methyl methacrylate), polyolefin, polycarbonate resin, and polyimide resin.

9. The organic EL device according to claim 7, wherein the insulative inorganic oxide, the insulative inorganic nitride, and the insulative inorganic oxide nitride include $SiO_x$, $SiN_x$, $SiN_xO_y$, $AlO_x$, $TiO_x$, $TaO_x$, or $ZnO_x$.

10. An organic EL device comprising:
a substrate,
a transparent electrode formed on the substrate,
an organic EL layer formed on the transparent electrode, and
a reflection electrode formed on the organic EL layer,
wherein the transparent electrode comprises first transparent electrode elements and second transparent electrode elements, each of the first transparent electrode elements being arranged alternately with each of the second transparent electrode elements, a side edge portion, which faces a line perpendicular to the surface of the substrate, of each of the first transparent electrode elements overlapping a side edge portion, which faces a line perpendicular to the surface of the substrate, of next second transparent electrode element through an insulation layer, and the first transparent electrode elements being electrically insulated from the second transparent electrode elements.

11. An organic EL device comprising:
a substrate,
a transparent electrode formed on the substrate,
an organic EL layer formed on the transparent electrode, and
a reflection electrode formed on the organic EL layer,
wherein the transparent electrode comprises first transparent electrode elements and second transparent electrode elements, each of the first transparent electrode elements being arranged alternately with each of the second transparent electrode elements to form a moisture barrier over the entire substrate, with a side edge portion of each of the first transparent electrode elements overlapping a side edge portion of next second transparent electrode element through an insulation layer which electrically insulates the first transparent electrode elements from the second transparent electrode elements.

* * * * *